United States Patent [19]

Lataire et al.

[11] 4,215,279
[45] Jul. 29, 1980

[54] APPARATUS FOR CONTROLLING THE OPERATION OF POWER TRANSISTORS IN A SWITCHING MODE

[76] Inventors: Philippe W. R. M. G. Lataire, Olympiadelaan 8, 1800 Vilvoorde; Gaston Magetto, Avenue Depage 27, Bte 8, 1050 Brussels; Jean-Louis Van Eck, Avenue du Saphir, 5, 1420, Braine-1+Alleud, all of Belgium

[21] Appl. No.: 884,302

[22] Filed: Mar. 7, 1978

[30] Foreign Application Priority Data

Mar. 7, 1977 [BE] Belgium ............................... 0175563

[51] Int. Cl.² ............................................. H03K 17/00
[52] U.S. Cl. ................................... 307/254; 307/255; 307/270; 307/300
[58] Field of Search ............... 307/253, 255, 270, 300, 307/254

[56] References Cited

U.S. PATENT DOCUMENTS 3,538,353  11/1970  Hanger ................................. 307/255
4,006,370  2/1977  Erler ................................... 307/300

Primary Examiner—Stanley D. Miller, Jr.
Assistant Examiner—B. P. Davis
Attorney, Agent, or Firm—Sughrue, Rothwell, Mion, Zinn and Macpeak

[57] ABSTRACT

Apparatus for automatically controlling the base current of a power transistor operating in a switching mode. Logic circuit means detect the collector-emitter voltage of the power transistor reaching a critical threshold at turn-on, and impedance feedback circuit means control the minimum conducting and blocking times of the power transistor. Circuit means are also provided to control the switching state of the power transistor and to produce a signal indicative of said switching state, thereby permitting plural power transistors to operate in a parallel arrangement.

6 Claims, 5 Drawing Figures

APPARATUS FOR CONTROLLING THE OPERATION OF POWER TRANSISTORS IN A SWITCHING MODE

FIELD OF THE INVENTION

This invention relates to an apparatus for controlling power transistors operating in a switching mode.

To date, the thyristor is the most commonly used static switching device in the electronic industry. However, the power transistor can be advantageously substituted for the thyristor, and this primarily since the advent of the high voltage transistor. In effect, it is an advantage of the transistor that it permits its conductivity to be controlled at any time, and for this reason the transistor appears to be the ideal switching device for applications operating in a controlled switching mode such as choppers, battery chargers, converters for feeding motors, standby supply units, induction heating apparatus, current regulating apparatus, for example.

Furthermore, the transistor enable circuit arrangements which operate faster than with thyristors. Despite its advantages, the transistor can be used as a substitution for the thyristor only if it is efficiently protected against current surges. Also, precautions are required to counteract special phenomena which appear in the switching mode, e.g. the phenomenon of secondary breakdown, excursion beyond the area of safety, etc. Furthermore, in applications where it is desired that plural power transistors are used in parallel, which is needed for providing higher power, it is required that precautions are taken to assure a good current distribution.

SUMMARY OF THE INVENTION

This invention provides a control apparatus for a power transistor operating in a switching mode which solves the above-mentioned problems and which makes it possible to withstand very heavy loads such as those arising when operating with a jammed mechanism or a direct short circuit at the converter terminals.

Another object of this invention is to provide a control apparatus for power transistors which permits plural such transistors to be simply connected in parallel and which permits different types of HT or LT power transistors to be used.

In accordance with the invention there is provided a control apparatus comprising a first transistor having its collector electrode connected to the input of power stage means, a second transistor having its collector electrode coupled to the emitter electrode of the first transistor, and a third transistor having its collector electrode coupled to the base electrode of the second transistor, said third transistor having its base electrode connected for accepting a control signal. First circuit means are connected between the base electrode of the first transistor and the collector electrode of the third transistor for driving the first transistor in a conducting state during a predetermined time to allow the collector-emitter voltage of the power transistor to reach a level lower than a predetermined threshold. Second circuit means comprising a resistor serially connected with at least one diode connects the base electrode of the first transistor to the collector electrode of the power transistor, in order to detect the collector-emitter voltage of the power transistor reaching a critical level at turn-on. Third circuit means are provided to connect an impedance between the collector electrode of the first transistor and the base electrode of the third transistor in order to set a minimum conducting time for the third transistor and hence for the power transistor.

DESCRIPTION OF AN EMBODIMENT

Figure 1:
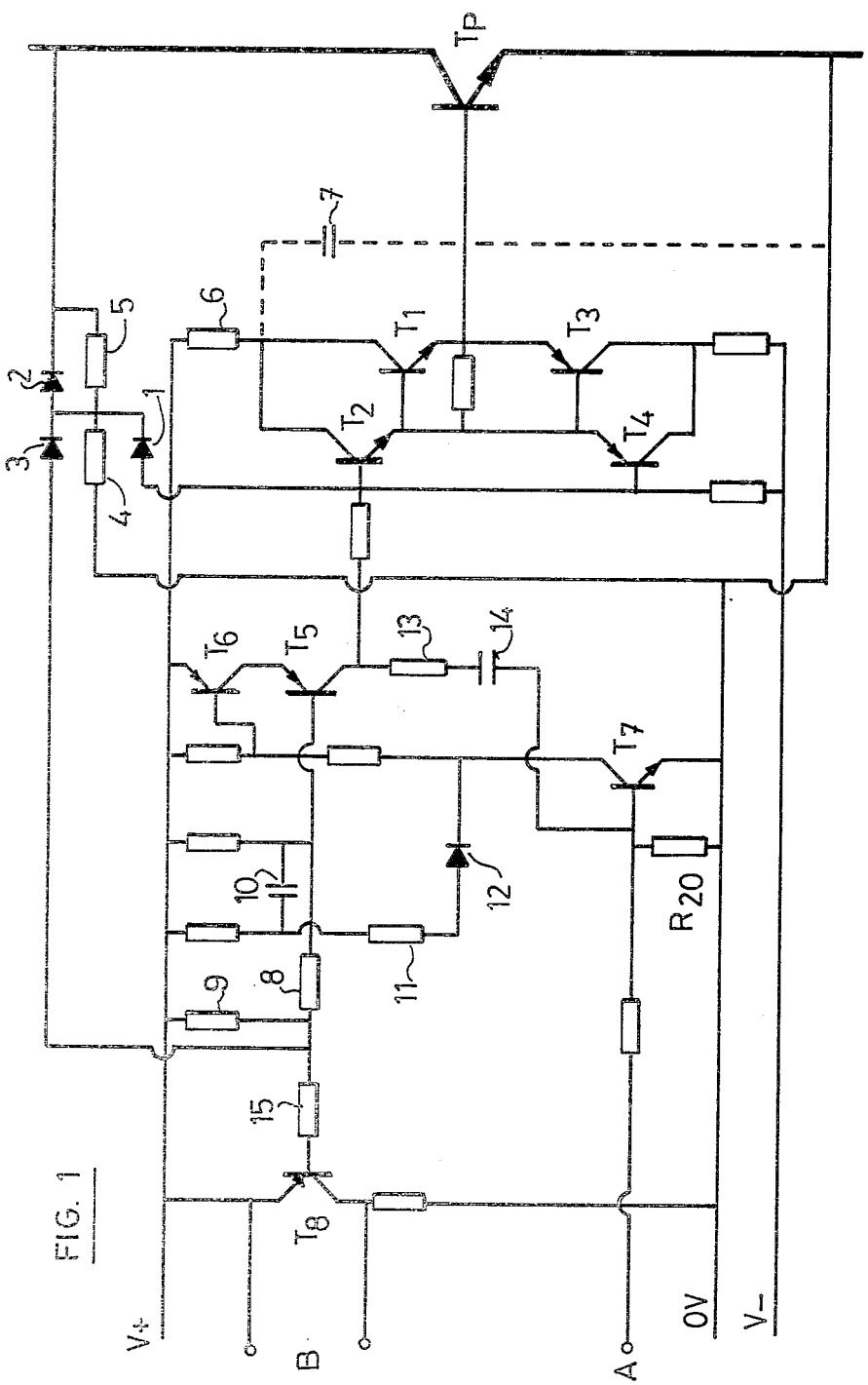
FIG. 1 is a schematic diagram of an examplary embodiment of the control apparatus according to the invention.

FIG. 1 shows a control circuit according to the invention intended to control the base current of power transistor Tp. This transistor represents a single component or plural parallel connected power transistors.

The base current of transistor Tp is derived from a power stage comprising transistor $T_1 T_2$ and $T_3 T_4$ connected in complementary Darlington arrangements, known per se. This power stage is controlled by a logic circuit comprising the transistors $T_5$, $T_6$, $T_7$. This logic circuit responds to a control signal applied to imput terminal A.

The transistors $T_3$ and $T_4$ provide a negative base current to power transistor $T_p$ when the latter is turned off whereby the collector current of the latter extinguishes more quickly.

The control circuit is fed by the D.C. supply sources $V+$ and $V-$.

The Darlington arrangements $T_1 T_2$ and $T_3 T_4$ can be replaced each by a different number of transistors depending on the valve of the base current to be supplied to transistor $T_p$ and on the components which are available.

A portion of the base current for transistor $T_2$ is derived through diodes 1 and 2. This results in a progressive base control which matches the base current of transistor $T_p$ to collector current, whereby the base current is limited which results in a substantial saving in the supply source requirements for the base control. Furthermore, this circuitry which controls the saturation state of the power transistor is effective to improve the blocking performance of the transistor. In the cases when the progressive control of the base current is not desired, for instance in order to obtain the lowest possible value for the saturation voltage of transistor $T_p$, the diode 1 can be omitted. When diodes are available which are able to withstand high voltage, the diode 3 can be omitted or, in the reverse case, serially connected diodes can be provided. In the former case the dividing resistors 4 and 5 can also be omitted.

The maximum value of the base current of transistor $T_p$ is determined by resistor 6. When transistor $T_1$ is saturated, the voltage across resistor 6 is maximum and the base current of transistor $T_p$ is at its maximum value. In cases where a heavy current requirements exits at turn-on, a capacitor 7 will be connected between resistor 6 and ground (OV).

First, circuit means are connected between the base of transistor $T_5$ and the collector of power transistor $T_p$ in order to detect the collector-emitter voltage of the power transistor $T_p$ reaching a critical level. These means comprise resistor 8 serially connected with at least one of diodes 3, 2 oriented as shown on FIG. 1. When the power transistor $T_p$ is conducting and when its collector-emitter voltage is sufficiently low, the transistor $T_5$ is kept conducting through the path comprising diodes 2 and 3 and resistor 8. Furthermore, circuit means comprising the capacitor 10, the resistor 11 and the diode 12 are serially connected as shown between the base of transistor $T_5$ and the collector of transistor $T_7$ in order to saturate transistor $T_5$ during a predetermined time at turn-on. The presence of transistor $T_5$ is necessary because when a short-circuit is provided instead, the protecting function is not assured. The diode 12 prevents the charge on capacitor 10 keeping transistor $T_6$ saturated for a longer time when transistor $T_7$ is blocked. When the collector-emitter voltage of the power transistor $T_p$ exceeds a critical threshold, transistor $T_5$ is no longer saturated amd transistors $T_3$, $T_4$ forming part of the power state apply a negative base current to transistor $T_p$, thereby causing the latter to turn off. Thus, the circuitry just described automatically detects a critical value of the collector-emitter voltage of the power transistor $T_p$, whereby fast, automatic and self-restoring protection against overcurrent is provided. The provision of said protecting means permits the power transistor $T_p$ to be used at its highest performance. Furthermore, this circuitry permits a plurality of power transistors to operate in a parallel arrangement without needing passive distributing elements provided that good electric connections are made between the emitter, base and collector electrodes of these transistors.

At turn-on of the power transistor $T_p$ the provision of the protecting means described above results in the production of a dead time which is proportional to the capacitance of capacitor 10. This dead time represents the time during which an excessive value of the collector-emitter voltage of transistor $T_p$ does not result in the base current being interrupted. The length of this dead time depends on the type of power transistor $T_p$ to be used and on the circuit arrangement wherein this transistor is to be used.

Figure 2:
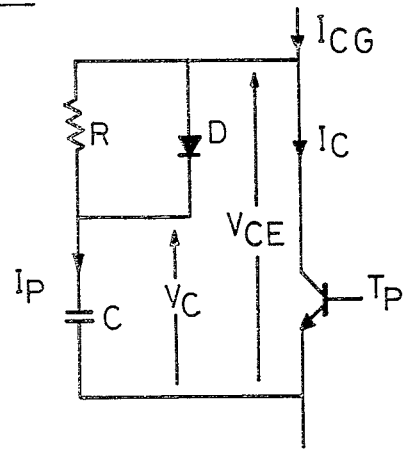
FIG. 2 is a simplified diagram of a protection circuitry to be used with a power transistor.

Feedback circuit means are also provided to control the minimum conducting and blocking times of the power transistor $T_p$. In the illustrated example, these circuit means comprise serially connected resistor 13 and capacitor 14, thereby providing an impedance between the collector of transistor $T_5$ and the base of transistor $T_7$. Thus, as soon as a control pulse which has a sufficient level to make transistor $T_7$ conducting is applied, even for a very short duration, transistor $T_7$ is kept conducting during a predetermined minimum time as a result of the time constant of the circuitry comprising capacitor 14, even when said control pulse has disappeared before the said minimum time has elapsed. A similar mechanism occurs at removal, even for a very short time, of the control pulse on the base of transistor $T_7$. By increasing the value of the feedback impedance connected between the collector of transistor $T_5$ and the base of transistor $T_7$ up to a substantially infinite level, minimum conducting and blocking times approaching zero are obtained. The presence of this feedback impedance permits power transistors to operate with a collector-emitter voltage higher than the standardized characteristic limit collector-emitter voltage VCEO (collector-emitter voltage with non-connected base) but lower than the other standardized collector-emitter limit voltage VCEX (collector-emitter voltage with negative base bias). Such an operation governs the dimensioning of the protecting circuit means for the power transistor $T_p$ at turn-off. These protecting means usually comprise a resistor (R), a diode (D) and a capacitor (C) arranged as shown in FIG. 2. Dimensioning these circuit means and designing the base current control circuitry of the invention have to be made while taking into account the particular requirements which are discussed hereafter.

Figure 4:
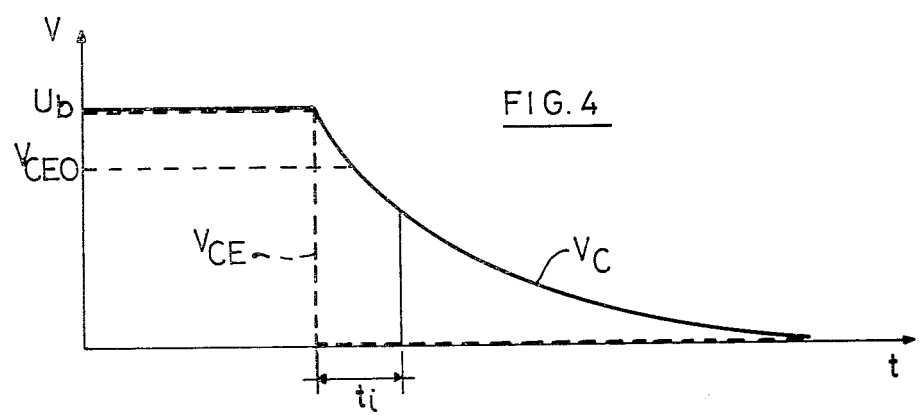
FIGS. 3 and 4 are diagrams showing characteristic curves which illustrate the operation of the controlled power transistor.
Figure 3:
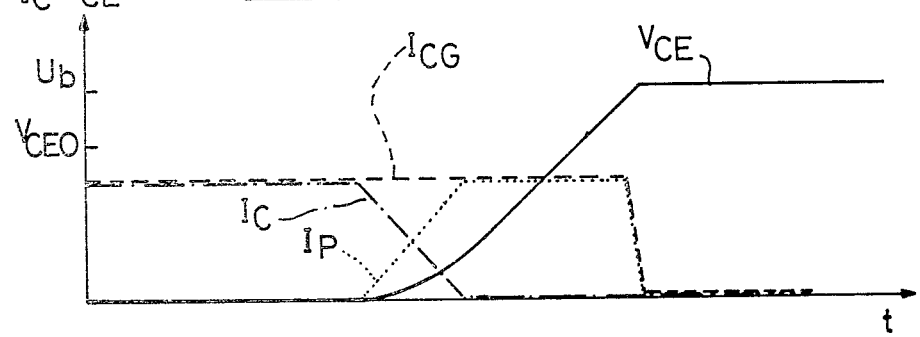

Assuming that the power circuitry in which transistor $T_p$ has to be used requires current until the collector-emitter voltage VCE reaches a level $U_b$, the following conditions should be satisfied:

(a) the value of the collector current $I_c$ must never exceed the leak current value of the power transistor in a blocking state when the collector-emitter voltage VCE is higher than VCEO as this could result in the semiconductor turning to an avalanche condition; the value of capacitor C has to be chosen such that the collector current $I_c$ has already reached zero value when VCE reaches the VCEO level (see diagram of FIG. 3);

(b) after the power transistor $T_p$ has turned ON it is necessary to prevent any blocking state until the voltage across capacitor C reaches a level substantially lower than VCEO (see diagram of FIG. 4); in the reverse case, the power transistor $T_p$ will have to interrupt a current at a voltage higher than VCEO and it probably will turn to an avalanche condition: this result is obtained by chosing the minimum conducting time $t_i$ as determined by the impedance of the circuit 13–14. Thus, when the power transistor is incidentally turned ON, (e.g. through a parasitic current, even with very short duration, on the control line), the control circuitry keeps the transistor conducting during the time which is necessary for causing the protection capacitor C to discharge to a sufficient extent.

Figure 5:
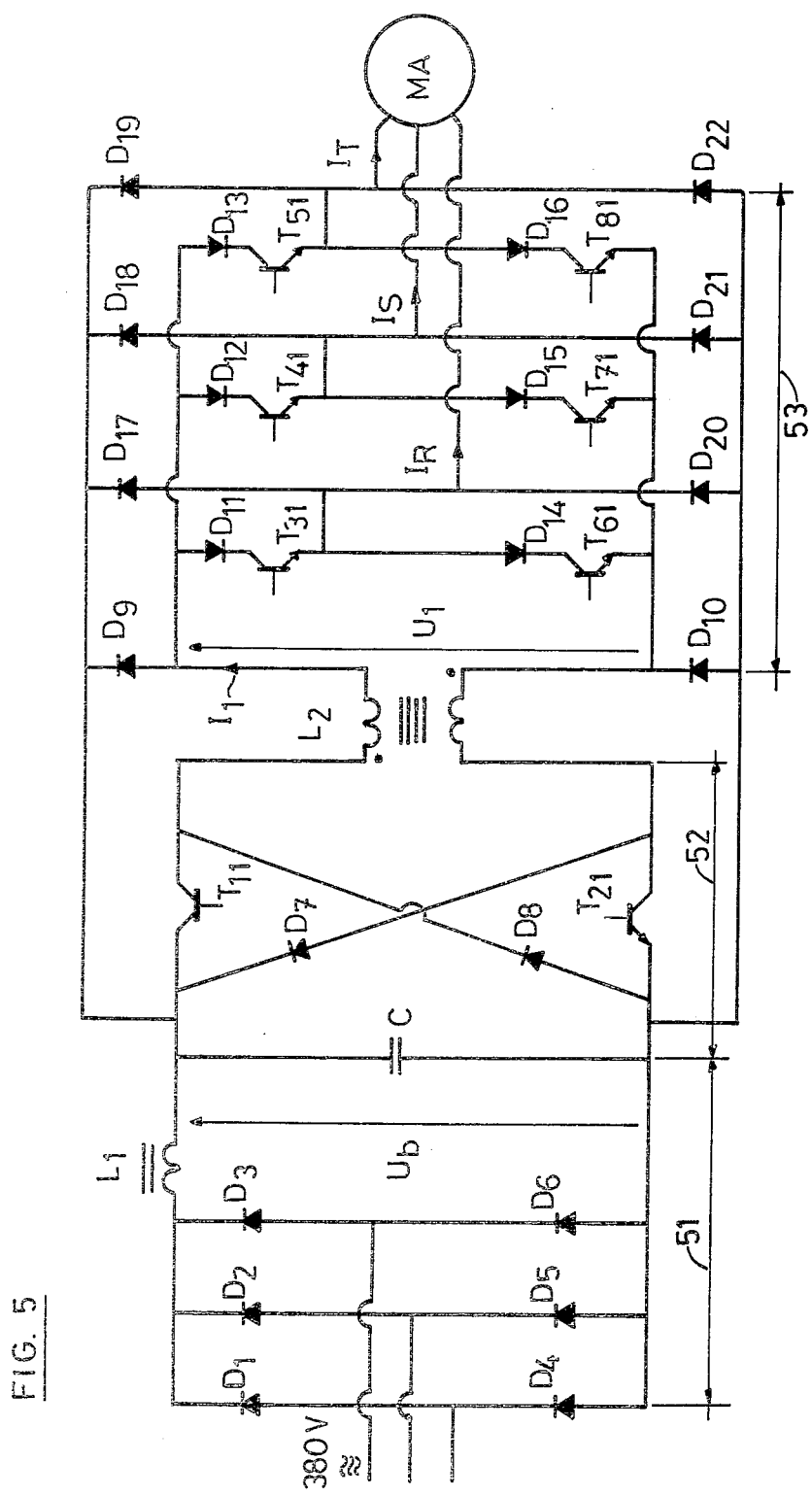
FIG. 5 is a schematic diagram of a converter apparatus using the control apparatus according to the invention.

An examplary application of the control apparatus in accordance with the invention is a converter for feeding DC motors from the 380 V mains as schematically illustrated in FIG. 5. This converter comprises the following sub-assemblies:

(a) a triphase mains rectifier sub-assembly 51 with smoothing inductance $L_1$ and filtering capacitor C for providing a DC supply voltage $U_b$, (b) a current-controlled chopper sub-assembly 52 capable of operating as a two-quadrant chopper; the output current $I_1$ always has the same polarity and the output voltage $U_1$ can vary between $+U_b$ and $-U_b$; when the current $I_1$ and the voltage $U_1$ have opposite polarities, the energy is fed back to the filtering capacitor C and when $I_1$ and $U_1$ have the same polarity the chopper feeds the load; the diodes $D_9$ and $D_{10}$ limit the output voltage at the level of the voltage across the filtering capacitor C; the transistors $T_{11}$ and $T_{21}$ in the chopper circuitry must be capable of withstanding the switching effects at a voltage VCEO greater than $U_b$; they can be driven by a base current control apparatus in accordance with the invention (FIG. 1);

(c) a current inverter sub-assembly 53 which is fed from a supply source for applying to the motor MA the desired current waveforms; the diodes $D_{11}$ to $D_{16}$ prevent the transistors to be reverse biased whereas the diodes $D_{17}$ to $D_{22}$ limit the voltage surges caused by the current switching mechanism in the motor MA at the voltage across capacitor C; the transistors $T_{31}$ to $T_{81}$ being connected to a current source, they are not subject to overloads resulting from freewheeling diode effects, so that use can be made of transistors having a VCEO lower than the supply voltage level and a VCEX greater than said supply voltage level; these transistors are then driven by base current control apparatus in accordance with the arrangement of FIG. 1 including circuit means for controlling the minimum conducting time.

The apparatus of the invention further comprises means for controlling and indicating the state (ON or OFF) of the power transistor $T_p$; this indication is especially useful in applications where two transistors may never be simultaneously ON such as for example in a voltage-fed inverter.

The information regarding the power transistor state is provided by transistor $T_8$. The base electrode of this transistor accepts a signal representing the collector voltage of transistor $T_p$. For that purpose the base electrode of transistor $T_8$ is connected through resistor 15 and diodes 3 and 2 to the collector electrode of transistor $T_p$. When the latter is turned on, its collector-emitter voltage is low and transistor $T_8$ is being saturated through diodes 2, 3 and resistor 15; when the power transistor $T_p$ is OFF, transistor $T_8$ is no longer saturated. Thus, the voltage at output terminals B in FIG. 1 is indicative of the power transistor $T_p$ state.

The output terminal B in FIG. 1 can be interconnected with the input terminal A in the control apparatus for a second power transistor through coupling means (not shown) capable of inhibiting said input terminal A when transistor $T_8$ is saturated and enabling the application of a control signal to input terminal A when transistor $T_8$ is OFF. Interconnecting the control apparatus for two power transistors thus makes it possible to prevent one power transistor from being turned ON while the other is still ON.

What is claimed is:

1. An apparatus for controlling the base current of a power transistor operating in a switching mode, said power transistor being fed through power stage means from a voltage source, the apparatus comprising logic means including:
    (a) a first transistor ($T_5$) having its collector electrode connected to the input of said power stage means;
    (b) a second transistor ($T_6$) having its collector electrode coupled to the emitter electrode of the first transistor;
    (c) a third transistor ($T_7$) having its collector electrode coupled to the base electrode of the second transistor, said third transistor having its base electrode connected to a control signal input terminal;
    (d) first circuit means connected between the base electrode of the first transistor and the collector electrode of the third transistor for driving the first transistor into a conductive state during a predetermined time to allow the collector-emitter voltage of the power transistor to reach a level lower than a predetermined threshold;
    (e) second circuit means comprising resistor means (8) serially connected with at least one diode (2, 3) between the base electrode of the first transistor and the collector electrode of the power transistor to detect the collector-emitter voltage of the power transistor reaching a critical level at turn-on; and
    (f) third circuit means comprising an impedance connected between the collector electrodes of the first transistor and the base electrode of the third transistor to establish a minimum conducting time for the third transistor and hence for the power transistor.

2. An apparatus according to claim 1, further comprising at least one further diode (1, 2) connected between an input to the power stage means and the collector electrode of the power transistor, said further diode being oriented such that its cathode electrode is connected to the collector electrode of the power transistor.

3. An apparatus according to claim 1, wherein said first circuit means comprises a serially connected capacitor (10), resistor (11) and diode (12), the latter diode being oriented such that its cathode electrode is connected to the collector electrode of the third transistor ($T_7$).

4. An apparatus according to claim 1, wherein said third circuit means comprises a serially connected resistor (13) and capacitor (14).

5. An apparatus according to claim 1, wherein the impedance of said third circuit means has a substantially infinite value.

6. An apparatus according to claim 1, further comprising a fourth transistor ($T_8$) whose base electrode is connected to a signal source indicative of the collector-emitter voltage of the power transistor, said fourth transistor being connected such that it is OFF when said collector-emitter voltage exceeds a predetermined threshold level.

* * * * *